(12) United States Patent
Jaklitsch

(10) Patent No.: US 11,563,444 B1
(45) Date of Patent: Jan. 24, 2023

(54) SUPPRESSING SPURIOUS SIGNALS IN DIRECT-DIGITAL SYNTHESIZERS

(71) Applicant: Textron Systems Corporation, Hunt Valley, MD (US)

(72) Inventor: James Joseph Jaklitsch, Parkton, MD (US)

(73) Assignee: Textron Systems Corporation, Hunt Valley, MD (US)

( * ) Notice: Subject to any disclaimer, the term of this patent is extended or adjusted under 35 U.S.C. 154(b) by 0 days.

(21) Appl. No.: 17/470,522

(22) Filed: Sep. 9, 2021

(51) Int. Cl.
| | | |
|---|---|---|
| *H03M 1/82* | (2006.01) | |
| *H03M 1/30* | (2006.01) | |
| *H03M 1/12* | (2006.01) | |
| *H03M 1/66* | (2006.01) | |
| *H03M 1/28* | (2006.01) | |

(52) U.S. Cl.
CPC .......... *H03M 1/822* (2013.01); *H03M 1/126* (2013.01); *H03M 1/282* (2013.01); *H03M 1/306* (2013.01); *H03M 1/665* (2013.01)

(58) Field of Classification Search
CPC ............ H03M 1/12; H03M 1/28; H03M 1/30; H03M 1/66; H03M 1/82
See application file for complete search history.

(56) References Cited

U.S. PATENT DOCUMENTS

| | | | |
|---|---|---|---|
| 5,218,324 A | 6/1993 | Lazarus | |
| 6,396,313 B1 | 5/2002 | Sheen | |
| 6,564,350 B1 | 5/2003 | Hoeweler et al. | |
| 6,570,458 B2 | 5/2003 | Cuddy | |
| 6,687,630 B2 | 2/2004 | Dionne | |
| 7,432,751 B2 | 10/2008 | Fang | |
| 7,545,224 B2 | 6/2009 | Chow et al. | |
| 8,046,396 B2 | 10/2011 | Xu | |
| 11,165,467 B1* | 11/2021 | Garon | H04B 7/18513 |
| 2007/0001888 A1* | 1/2007 | Draxelmayr | H03M 1/662 341/155 |
| 2011/0200077 A1* | 8/2011 | Mitani | H03M 3/388 341/143 |
| 2016/0173120 A1* | 6/2016 | Doare | H03M 3/378 341/120 |
| 2022/0217026 A1* | 7/2022 | Bandyopadhyay | H04L 27/01 |

FOREIGN PATENT DOCUMENTS

EP          3709518 A1 *   9/2020   ............ H03M 3/322

OTHER PUBLICATIONS

Analog Device Inc., "Data Sheet AD9119/AD9129 11-/14-Bit, 5.7 GSPS RF Digital-to-Analog Converter," 2017 Downloaded Sep. 30, 2021 from https://www.analog.com/media/en/technical-documentation/data-sheets/AD9119_9129.pdf.

* cited by examiner

Primary Examiner — Lam T Mai

(74) Attorney, Agent, or Firm — BainwoodHuang

(57) ABSTRACT

A technique for generating analog waveforms includes combining a desired, in-band signal with a randomizing, out-of-band signal at an input of a DAC, operating the DAC to generate DAC output based on a combination of the desired signal and the randomizing signal, and filtering the DAC output to pass the desired signal while removing the randomizing signal.

20 Claims, 5 Drawing Sheets

SUPPRESSING SPURIOUS SIGNALS IN DIRECT-DIGITAL SYNTHESIZERS

BACKGROUND

Direct-digital synthesizers (DDSs) find common usage in many areas of technology that require the generation of analog waveforms. These areas include, for example, telecommunications, simulations, audio/video equipment, and electronic test equipment. A central component of a DDS is a DAC (digital-to-analog converter), i.e., a device that converts digital inputs (numbers) to analog outputs (voltages or currents). In a common arrangement, the DAC is fed a sequence of digital input values that describe successive levels of a desired waveform, such as a sine wave or any other periodic waveform. For each digital input value, the DAC generates a corresponding analog output whose voltage or current is proportional to the numerical value of the input. Each output from the DAC appears as a single voltage or current level, but the sequence of outputs describes the desired waveform. Typically, a low-pass or band-pass filter is applied to the output of the DAC to smooth transitions between discrete levels and to render the output as a continuous signal.

Some applications place high demands on DDSs in terms of the spectral purity of their output signals. For example, a DDS programmed to generate a sine wave should ideally produce a single tone, at the sine wave's frequency, but should produce little or no output at other tones. There should ideally be minimal harmonics, noise, or spurs. As is known, "spurs" are erroneous tones whose magnitude (size) is well above a usual noise floor of the DDS output. Spurs can interfere with the proper functioning of equipment, which may malfunction or perform poorly in their presence. Minimization of spurs is thus a critical aspect of DDS design.

SUMMARY

Unfortunately, many DACs inherently produce spurs at their outputs, which degrade the performance of DDSs that use those DACs. For example, a DAC may do an imperfect job of transforming digital numbers into analog levels. Some transitions between adjacent levels may be too large whereas others may be too small. When the DAC having such errors is operated to produce a periodic waveform (such as a sine wave), the same transition errors tend to repeat, with the overall effect being that additional frequency content appears at the DAC's output in the form of spurs. Such spurs may be small in magnitude, but they may nevertheless be large enough to interfere with or degrade the performance of downstream equipment. What is needed is a way of reducing spurs introduced by DACs in DDS outputs.

To address the above need at least in part, an improved technique for generating analog waveforms includes combining a desired, in-band signal with a randomizing, out-of-band signal at an input of a DAC, operating the DAC to generate DAC output based on a combination of the desired signal and the randomizing signal, and filtering the DAC output to pass the desired signal while removing the randomizing signal.

Advantageously, the randomizing signal prevents the same DAC transition errors from repeating periodically, disrupting the mechanism by which spurs caused by such transition errors are formed and dramatically suppressing spurs in the DAC output. DDSs constructed in accordance with the improved technique are thus better suited for demanding applications that require high spectral purity and thus result in improved performance of equipment used in those applications.

Certain embodiments are directed to a method of generating analog waveforms. The method includes combining a first digital signal with a second digital signal at an input of a DAC (digital-to-analog converter), the first digital signal representing a desired output waveform, the second digital signal providing randomizing content. The method further includes operating the DAC to generate DAC output based on a combination of the first digital signal and the second digital signal and filtering the DAC output to pass the desired output waveform while removing the randomizing content.

In some examples, the first digital signal extends over a first bandwidth and the second digital signal extends over a second bandwidth. The first bandwidth is distinct from the second bandwidth and higher in frequency than the second bandwidth.

In some examples, the first bandwidth has a lower frequency limit, the second bandwidth has an upper frequency limit, and the upper frequency limit of the second bandwidth extends to at least one-half the lower frequency limit of the first bandwidth.

In some examples, the upper frequency limit of the second bandwidth is a positive frequency and the second bandwidth further has a lower frequency limit that is a negative frequency.

In some examples, the negative frequency of the lower frequency limit of the second bandwidth has a same absolute value as the upper frequency limit of the second bandwidth.

In some examples, the second bandwidth extends over a frequency range that includes both positive and negative frequencies.

Some examples further include generating the second digital signal based at least in part on generating a sequence of multi-bit digital values, the multi-bit digital values being random or pseudo-random, and transforming the multi-bit digital values into sinusoidally-varying digital values, the sinusoidally-varying digital values having frequencies based on the multi-bit digital values.

In some examples, the sequence of multi-bit digital values is generated at a first rate, the DAC is activated to generate new output at a second rate, and the second rate is a multiple of the first rate.

Some examples further include interpolating between successive multi-bit digital values of the sequence of multi-bit digital values, the interpolating causing the sinusoidally-varying digital values to change frequency incrementally over multiple time intervals between successive multi-bit digital values.

In some examples, interpolating between successive multi-bit digital values of the sequence of multi-bit digital values includes linearly interpolating, such that the sinusoidally-varying digital values change frequency linearly between successive multi-bit digital values.

In some examples, the first digital signal has a first amplitude, the second digital signal has a second amplitude, and the second amplitude is between 50% and 75% of the first amplitude.

In some examples, the first digital signal has a first amplitude, the second digital signal has a second amplitude, and the second amplitude is no greater than five times the first amplitude.

Other embodiments are directed to a direct digital synthesizer (DDS). The DDS includes a combiner having a first input configured to receive a first digital signal, a second input configured to receive a second digital signal, and an output configured to provide a combined digital signal, the first digital signal representing a desired output waveform, the second digital signal providing randomizing content. The DDS further includes a DAC having an input configured to receive the combined digital signal and an output configured to provide an analog representation of the combined digital signal, and a filter coupled to the output of the DAC, the filter configured to pass the desired output waveform and to remove the randomizing content.

In some examples, the DDS further includes a number generator of multi-bit digital values that are random or pseudo-random, and a phase accumulator having an input coupled to the number generator and an output that provides the second digital signal as a sequence of sinusoidally-varying digital values having frequencies based on the multi-bit digital values.

In some examples, the number generator is configured to generate multi-bit digital values at a first rate, the DAC is configured to generate new output at a second rate, and the second rate is a multiple of the first rate.

In some examples, the DDS further includes an interpolator coupled between the number generator and the phase accumulator, the interpolator configured to interpolate between successive multi-bit digital values generated by the number generator.

In some examples, the interpolator is a linear interpolator configured to linearly interpolate between successive multi-bit digital values generated by the number generator.

Additional embodiments are directed to DAC circuit, including: a combiner configured to combine a first digital signal with a second digital signal to produce a combined signal, the first digital signal representing a desired output waveform, the second digital signal providing randomizing content; a DAC coupled to the combiner, the DAC configured to generate DAC output based on the combined signal; and a filter coupled to the DAC and configured to filter the DAC output by passing the desired output waveform while removing the randomizing content.

In some examples, the filter is further configured to remove the randomizing content at lower frequencies and to pass the desired output waveform at higher frequencies.

In some examples, the filter is further configured to remove the randomizing content at both positive and negative frequencies.

The foregoing summary is presented for illustrative purposes to assist the reader in readily grasping example features presented herein; however, this summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments, as illustrated in the accompanying drawings, in which like reference characters refer to the same or similar parts throughout the different views.

DETAILED DESCRIPTION

Embodiments of the improved technique will now be described. One should appreciate that such embodiments are provided by way of example to illustrate certain features and principles but are not intended to be limiting.

An improved technique for generating analog waveforms includes combining a desired, in-band signal with a randomizing, out-of-band signal at an input of a DAC, operating the DAC to generate DAC output based on a combination of the desired signal and the randomizing signal, and filtering the DAC output to pass the desired signal while removing the randomizing signal.

Figure 1:
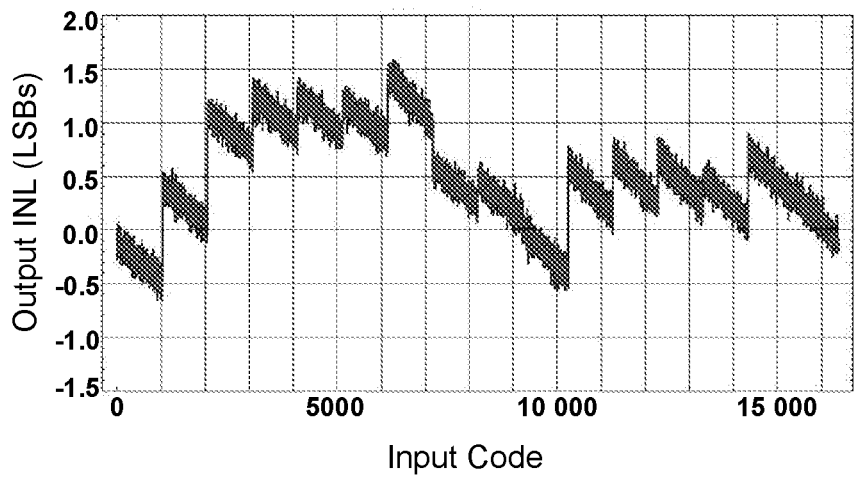
FIG. 1 is a graph of integral non-linearity versus input code of an example DAC.

FIG. 1 shows an example graph of integral non-linearity (INL) versus input code for a particular DAC. In the depicted example, the DAC has a two-stage design with both fine and coarse settings. This is merely an example, though, as similar issues can arise with other types of DACs. The particular INL of the DAC can vary from that shown with changes in output current, temperature, and other factors. Thus, the INL of the DAC at any particular time may be chaotic and difficult to predict.

Rather than showing absolute values of DAC output, FIG. 1 instead shows INL as differences between actual and ideal DAC output over the entire input code range. The INL is measured in LSBs, or least-significant bits. The DAC in the example shown has 14 bits of resolution, so that one LSB is $\frac{1}{2}^{14}$ times the full-scale output range of the DAC. For example, if the full-scale range of the DAC is 10 volts, then one LSB corresponds to about 0.6 milli-volts.

When the DAC of FIG. 1 is operated to generate periodic output signals, such as sine waves, the same input codes and thus the same code transitions are repeated over and over again, with the effect being to introduce spurs into the DAC output. An example of such spurs is shown in FIG. 2.

Figure 2:
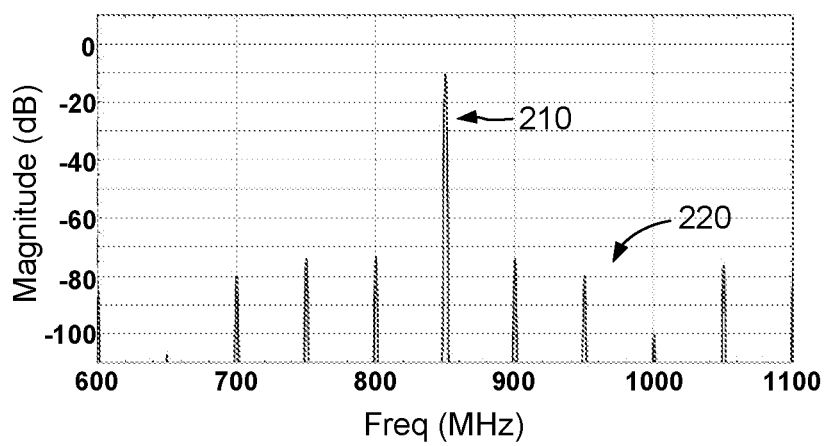
FIG. 2 is a graph showing an example simulated power spectrum of a tone produced at the output of the DAC, wherein numerous spurs can be seen.

FIG. 2 shows an example power spectrum of the output of a DAC having the INL as shown in FIG. 1. The depicted graph is simulated, so there is no apparent noise floor. Here, the DAC is configured to output a single tone 210 at 850 MHz (megahertz). However, various spurs 220 can also be seen. The spurs repeat at 50 MHz intervals, which are based on the 850 MHz output tone folding across the DAC's clock frequency, which in this case is 2.5 GHz (gigahertz).

The spurs 220 are a direct mathematical consequence of the DAC's INL, clock frequency, and configured output frequency. The precise number and locations of spurs changes with changes in DAC output frequency (and/or clock frequency). As the DAC output is allowed to vary over a range of frequencies, suppression of spurs using filters or other simple approaches is not feasible. Although the spurs 220 are significantly smaller than the output tone 210, they are still too large for the most demanding applications, where their presence can cause downstream equipment to underperform or malfunction.

Figure 3:
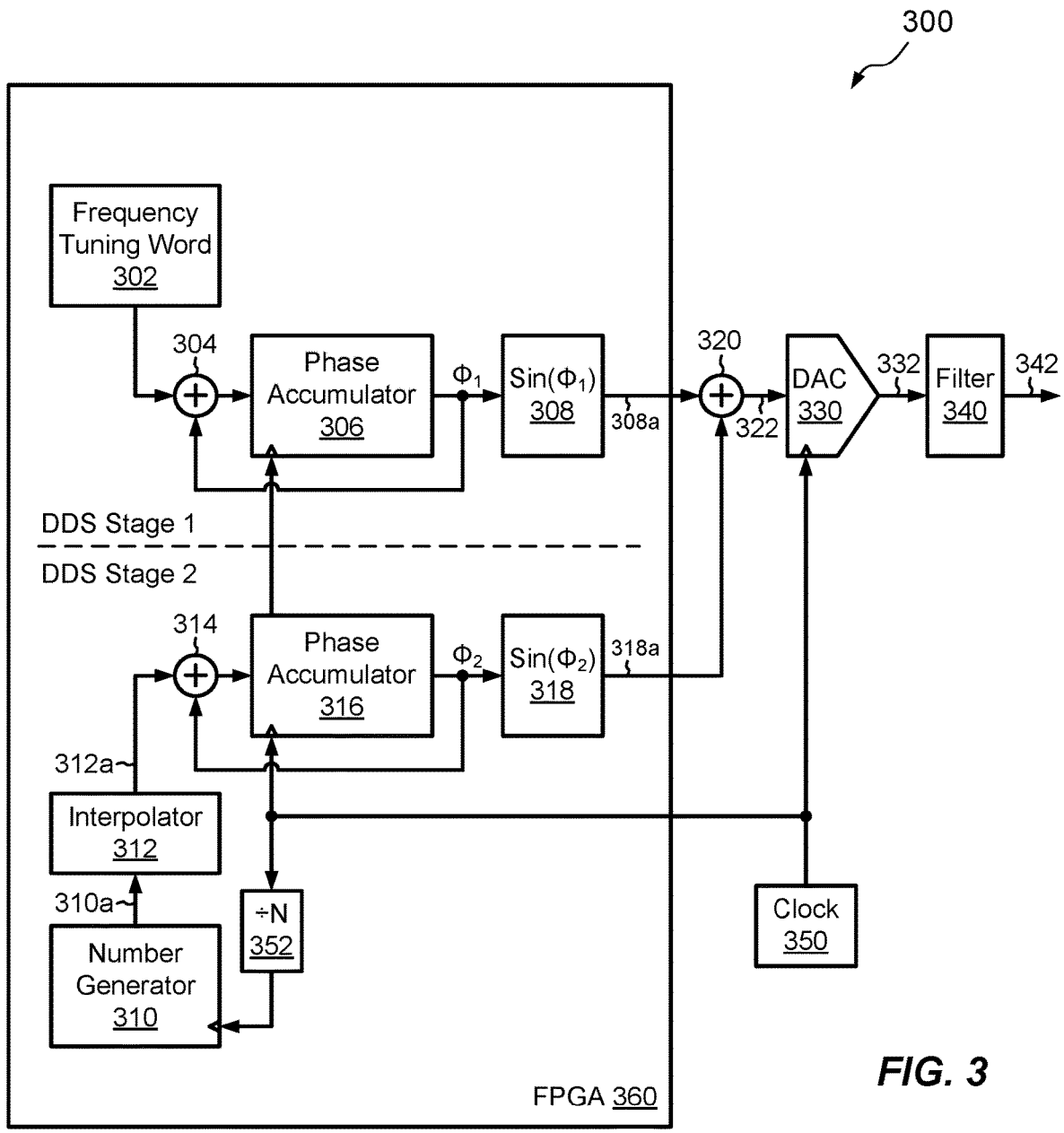
FIG. 3 is a block diagram showing an example DDS in accordance with certain embodiments of the disclosure.

FIG. 3 shows an example DDS 300 according to certain embodiments. In the FIG. 3 arrangement, spurs arising from DAC INL are suppressed or completely avoided. As shown, the DDS 300 includes two stages. A first DDS stage (DDS Stage 1) is configured to produce a first digital signal, which represents a desired output signal, and a second DDS stage (DDS Stage 2) is configured to produce a second digital signal, which provides randomizing content.

The first DDS stage includes a frequency tuning word 302, a summer 304, a phase accumulator 306, and a waveform function 308. The frequency tuning word 302 is a digital value that sets a desired output frequency of the DDS 300. Smaller values correspond to lower frequencies and larger values correspond to higher frequencies. Summer 304 adds the value of the frequency tuning word 302 to the output of the phase accumulator 306 ($\Phi_1$), thus generating a new input to the phase accumulator 306 on each clock cycle. In an example, the phase accumulator 306 is provided in the form of an a-bit binary register, which is configured to roll over when the accumulated digital phase value reaches $2^a$. The output range of the phase accumulator 306 thus extends from 0 to $2^a-1$, which corresponds to a phase that ranges from 0 to just under 360 degrees $$\left(\text{i.e., } 360 * \frac{2^a - 1}{2^a}\right).$$

In an example, the phase accumulator 306 is clocked at a higher frequency than the one specified by the frequency tuning word 302. In an example, a clock 350 operates at 2.5 GHz and the frequency specified by the frequency tuning word 302 ranges from 600 MHz to 1100 MHz. This arrangement ensures that the Nyquist rate is satisfied by producing at least two samples per cycle of the desired output frequency.

The waveform function 308 is configured to translate accumulated phase values $\Phi_1$ to corresponding digital waveform values. For example, if the desired output waveform is a sine wave, then the waveform function 308 stores values of $\sin(\Phi_1)$, e.g., one value for each of the $2^a$ possible input values. In some examples, waveform function 308 is implemented using a look-up table. Amplitude may be adjusted by scaling up or down the values in the lookup table, and/or by multiplying or dividing values produced by the waveform function 308. The output values from the waveform function 308 provide the above-described first digital signal 308a, which thus represents the desired output waveform, e.g., a sine wave at a frequency defined by the frequency tuning word 302.

Turning now to the second DDS stage, a similar design is employed. Here, a summer 314, phase accumulator 316, and waveform function 318 perform similar roles as those described above for summer 304, phase accumulator 306, and waveform function 308. The two stages differ, however, in that DDS Stage 2 employs a number generator 310 and an interpolator 312 in place of the frequency tuning word 302. Number generator 310 is configured to produce multi-bit numbers (digital values) 310a, which are preferably random or pseudo-random. The number generator 310 may be implemented in a variety of ways known to those skilled in the art, such as by using a linear feedback shift register, for example.

In the context of FIG. 3, the random or pseudo-random numbers 310a correspond to frequencies, and the frequencies extend over an out-of-band range, such as a range of frequencies lower than the one over which the first digital signal 308a varies. For example, if the first digital signal 308a varies between 600 MHz and 1100 MHz, then the frequency range specified by the random or pseudo-random numbers 310a may extend from DC to 450 MHz, or between −350 MHz and +350 MHz, for example.

Interpolator 312 is configured to interpolate between adjacent random or pseudo-random numbers 310a. Linear or higher-order interpolation may be used (e.g., second or third-order interpolation), as well as other curve-fitting techniques. Linear interpolation has been found adequate for most requirements. The interpolator 312 may be omitted in certain embodiments, but it has been found to reduce sidelobe energy significantly and thus to enable improved performance.

In an example, the number generator 310 is clocked at a lower frequency than the phase accumulators 306 and 316, which may be clocked at the same rate. For example, a clock divider 352 may divide the frequency of clock 350 by an integer N, where N may be a power of two, such as 64, 128, or 256, for example. Dividing the clock frequency allows random frequencies to fully develop and thus to affect accumulated phase ($\Phi_2$). With a clock frequency of 2.5 GHz and a value of N of 128, for example, the number generator 310 produces a new random or pseudo-random number every 51.2 ns (nanoseconds). Interpolator 312 connects these numbers linearly (assuming linear interpolation), which thus produces incrementally increasing and decreasing values 312a.

With the depicted arrangement, the phase accumulator 316 and waveform function 318 transform the interpolated numbers 312a into the above-described second digital signal 318a, which is produced as a sequence of sinusoidally-varying digital values. The frequency of the second digital signal 318a varies based on the interpolated numbers 312a, e.g., the same way the frequency of the first digital signal 308a varies based on the frequency tuning word 302. A significant difference, however, is that the second digital signal 318a has random or pseudo-random frequency, whereas the first digital signal 308a has a frequency that is generally determined in advance, e.g., based on a programmed value.

A combiner 320 receives and combines output of the two DDS stages. As shown, combiner 320 has a first input that receives the first digital signal 308a from DDS Stage 1 and a second input that receives the second digital signal 318a from DDS Stage 2. The combiner 320 combines (e.g., adds, subtracts, or performs some other combining function) the first digital signal 308a with the second digital signal 318a to produce a combined output 322, which is provided as an input to a DAC 330. In an example, the DAC 330 is clocked at the same frequency (e.g., 2.5 GHz) as the phase accumulators 306 and 316. The DAC 330 thus produces an analog output 332 (e.g., a voltage or current), which updates every clock cycle and includes both a desired component (from DDS Stage 1) and a randomizing component (from DDS Stage 2). Because the randomizing component is out-of-band, e.g., extending over a lower frequency range than the desired component, a filter 340 can easily remove the randomizing component via low-pass filtering. In an example, the filter 340 is provided as an analog band-pass filter, with a lower cut-off frequency set to attenuate the randomizing component and an upper cut-off frequency set to remove quantization effects. The filter has an output 342, which may be coupled to additional processing stages (e.g., amplifiers, attenuators, etc.), which are not shown.

The DDS 300 may be implemented in a variety of ways. One suitable approach implements certain components of the DDS 300 in an FPGA (field-programmable gate array) 360, e.g., in the manner shown. Other samples may implement the DDS 300 or portions thereof using an ASIC (application-specific integrated circuit). Still other examples may implement the DDS 300 or portions thereof using a DSP (digital signal processing) processor, using a general-purpose computer, using discrete components, or using any combination of the above. When implemented on a DSP processor or other computer, the digital components of the DDS 300 (e.g., components 302, 304, 306, 308, 310, 312, 314, 316, 318, and 320) may be implemented in digital memory using software instructions and data. When the software instructions are run by control circuitry of the DSP processor or other computer, the control circuitry is made to carry out the functions and acts as described above.

Figure 4:
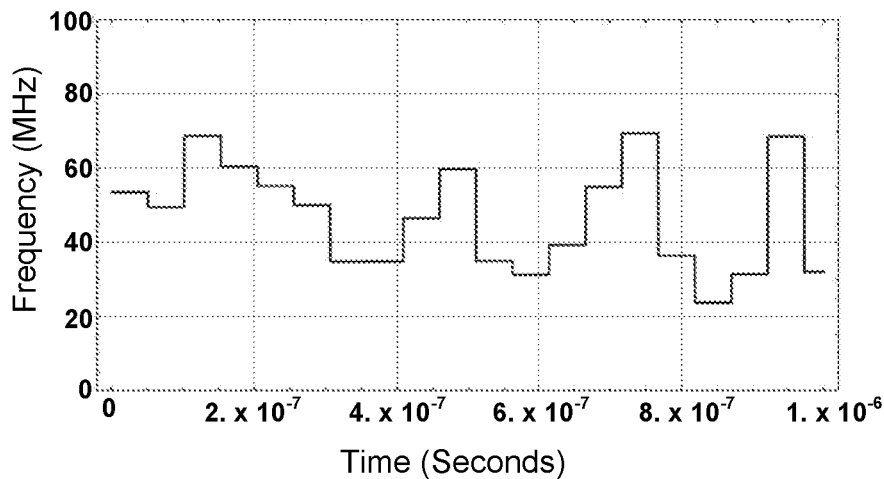
FIG. 4 is a graph showing example frequencies versus time based on random or pseudo-random numbers which may be generated by the DDS of FIG. 3.

FIG. 4 shows an example graph of random or pseudo-random numbers 310a as generated by the number generator 310 as a function of time. Although the numbers 310a themselves are unitless, multi-bit numbers, the vertical axis of the graph is labeled in units of frequency (MHz), as the numbers 310a as used in DDS 300 specify frequencies of sinusoidally-varying values of the second digital signal 318a. In the example shown, the numbers 310a correspond to random frequencies in the range between about 20 MHz and 70 MHz. The frequency range of the second digital signal 318a can be different from this 20-70 MHz range, however. For example, some implementations allow the frequencies of the second digital signal 318a to vary between 0 and 450 MHz. Other implementations allow the frequencies of the second digital signal 318a to vary over an even larger range, which may include both positive and negative frequencies. "Negative frequencies" are defined herein as those produced by decreasing output values of phase accumulator 316, whereas positive frequencies are defined as those produced by increasing output values of phase accumulator 316.

Figure 5:
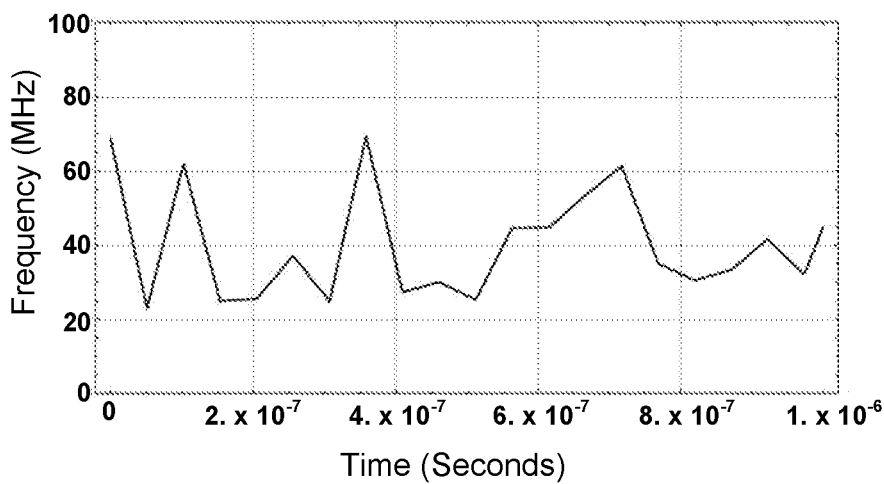
FIG. 5 is a graph showing example frequencies versus time based on interpolated random or pseudo-random numbers which may be generated by the DDS of FIG. 3.

FIG. 5 shows an example graph of interpolated random or pseudo-random numbers 312a, i.e., those produced by interpolator 312 (FIG. 3). Here, interpolator 312 is configured to perform linear interpolation. The graph is similar to the one shown in FIG. 4, except that generation of a new random or pseudo-random number 310a causes the interpolator 312 to begin changing from its current value to the new value, e.g., by following a linear numerical ramp from one value to the next. In an example, the interpolator 312 produces numerical ramps with a slope of $\Delta N/\Delta t$, where $\Delta N$ is the new number 310a minus the current number and $\Delta t$ is the time between successive updates of the number generator 310, e.g., 51.2 ns.

Figure 6:
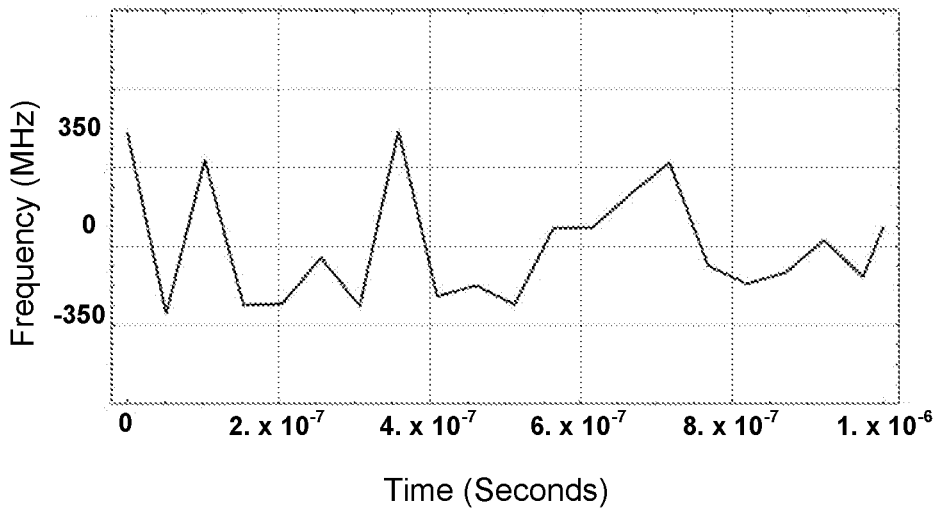
FIG. 6 is a graph showing example frequencies versus time based on interpolated random or pseudo-random numbers, where the generated frequencies are both positive and negative.

FIG. 6 shows another example graph of interpolated random or pseudo-random numbers 312a. Here, however, the numbers 310a correspond to a frequency range of −350 MHz to +350 MHz, rather than the 20-70 MHz range described above. Providing numbers 310a that include both positive and negative values allows the randomizing content to extend over a larger range of frequencies than would be possible if only positive values were used. We have observed that the larger the bandwidth over which randomizing content is spread, the less an image of the randomizing content appears in-band. For example, limiting the randomizing content to the 20-70 MHz range has been observed to cause a localized rise to appear in the noise floor, with the localized rise resembling the randomizing content. However, spreading the randomizing content over a larger frequency range reduces the rise and spreads out its effects more widely. Choosing a range for the randomizing content between −350 MHz and +350 MHz results in no obvious localized increase in noise.

Figure 7:
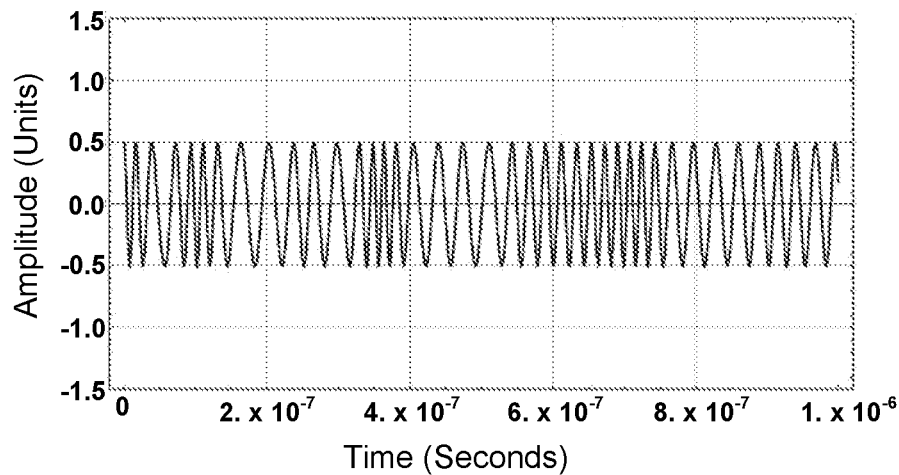
FIG. 7 is a graph showing an example sinusoidally-varying digital signal generated based on the interpolated random or pseudo-random numbers.

FIG. 7 shows an example graph of the second digital signal 318a versus time. As shown, the frequency of the second digital signal 318a varies based on changes in the interpolated numbers 312a, while amplitude remains constant. Although the second digital signal 318a is shown as a waveform, one should keep in mind that it is actually a succession of digital values that describe a waveform. The unitless amplitude of the digital values is 0.5, which may be relative to an amplitude of 1.0 for the first digital signal 308a.

Ideally, the amplitude of the second digital signal 318a, i.e., the one providing the randomizing content, should be large enough to toggle all bits of the DAC 330, thus ensuring that no bit transitions are excluded from the randomizing effects. Providing the amplitude of the second signal 318a as half that of the signal 308a generally achieves this result. Preferably, the amplitude of the second signal 318a is between 50% and 75% of the amplitude of the first signal 308a, with 70% providing a near optimal result.

The amplitude ranges above assume that the amplitude of the first signal 308a is approximately one-half the full-scale range of the DAC 330. It has been observed that driving the DAC at half of its full-scale range elicits minimal distortion. Thus, the 50%-to-75% range identified above corresponds to an amplitude range for the second digital signal 318a of between 25% and 37.5% the full-scale range of the DAC.

For smaller amplitudes of the first signal 308a, it is not strictly necessary for the second signal 318a to toggle all bits of the DAC 330, as the first signal 308a will not by itself cause such bit transitions to occur. In such cases, the amplitude of the second signal 318a may be allowed to assume smaller values. For small amplitudes of the first signal 308a, the amplitude of the second signal 318a should preferably never exceed five times that of the first signal 308a.

Figure 8:
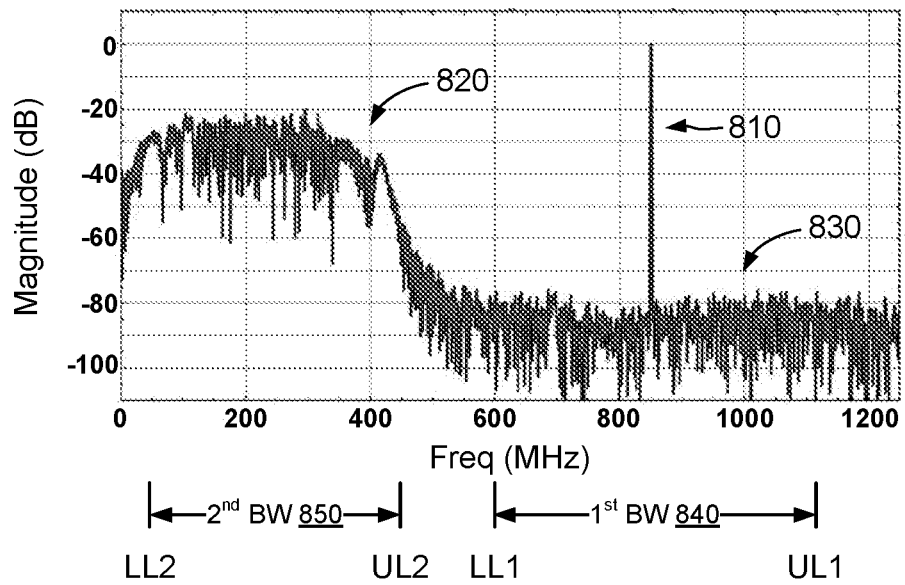
FIG. 8 is a graph showing an example power spectrum of an unfiltered output of the DAC in the DDS of FIG. 3 according to certain embodiments.
Figure 9:
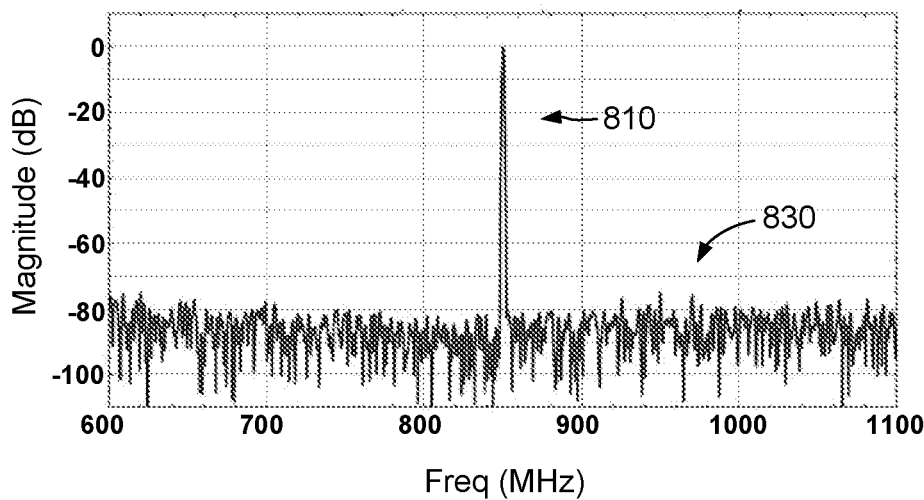
FIG. 9 is a graph showing an example power spectrum of a filtered output of the DAC in the DDS of FIG. 3 according to certain embodiments.

FIG. 8 shows an example power spectrum of a tone produced at the output of the DAC 330 prior to filtering by filter 340, and FIG. 9 shows the corresponding results after filtering. The tone 810 appears at 850 MHz, but the DDS 300 allows the tone to vary anywhere within a first bandwidth 840, which in this example extends from 600 MHz to 1100 MHz. Also shown in FIG. 8 is randomizing content 820, which is produced by the digital signal 318a. The second digital signal 318a extends over a second bandwidth 850, which in this example ranges from 50 MHz to 450 MHz. The time window over which the power spectrum of FIG. 8 is acquired is long enough to allow many random frequencies in the second bandwidth 850 to fill, i.e., resulting from a large number of interpolated random or pseudo-random numbers 312a producing respective frequencies.

As shown, the first bandwidth 840 and the second bandwidth 850 are distinct from each other, with the first bandwidth 840 being higher than the second bandwidth 850. The second bandwidth 850 is preferably as large as practicable. For example, the upper frequency limit (UL2) of the second bandwidth 850 is at least one-half the lower frequency limit (LL1) of the first bandwidth 840. In some examples, such as the one shown in FIG. 6, the lower limit (LL2) of the second bandwidth 850 is negative. In some examples where the second bandwidth 850 includes both positive and negative frequencies, the second bandwidth 850 may be centered on zero, such that the upper limit and the lower limit of the second bandwidth 850 has the same absolute value.

It is noteworthy that no spurs can be seen within the first bandwidth 840, which has a noise floor 830 of approximately −80 dB. The results after filtering (FIG. 9) are free of all spurs.

One should appreciate that the signal shown in FIG. 9 owes is spectral purity to the effects of randomizing content added at the input of the DAC 330. Rather than repeating the same INL errors of the DAC cycle after cycle, the randomizing content disrupts the patterns of repeated INL errors and eliminates the spurs caused by such patterns. The DAC INL errors are still present, but they are not repeated with the same regularity, so they are unable to accumulate. Rather, the randomizing signal has the effect of distributing the errors randomly across many frequencies.

Figure 10:
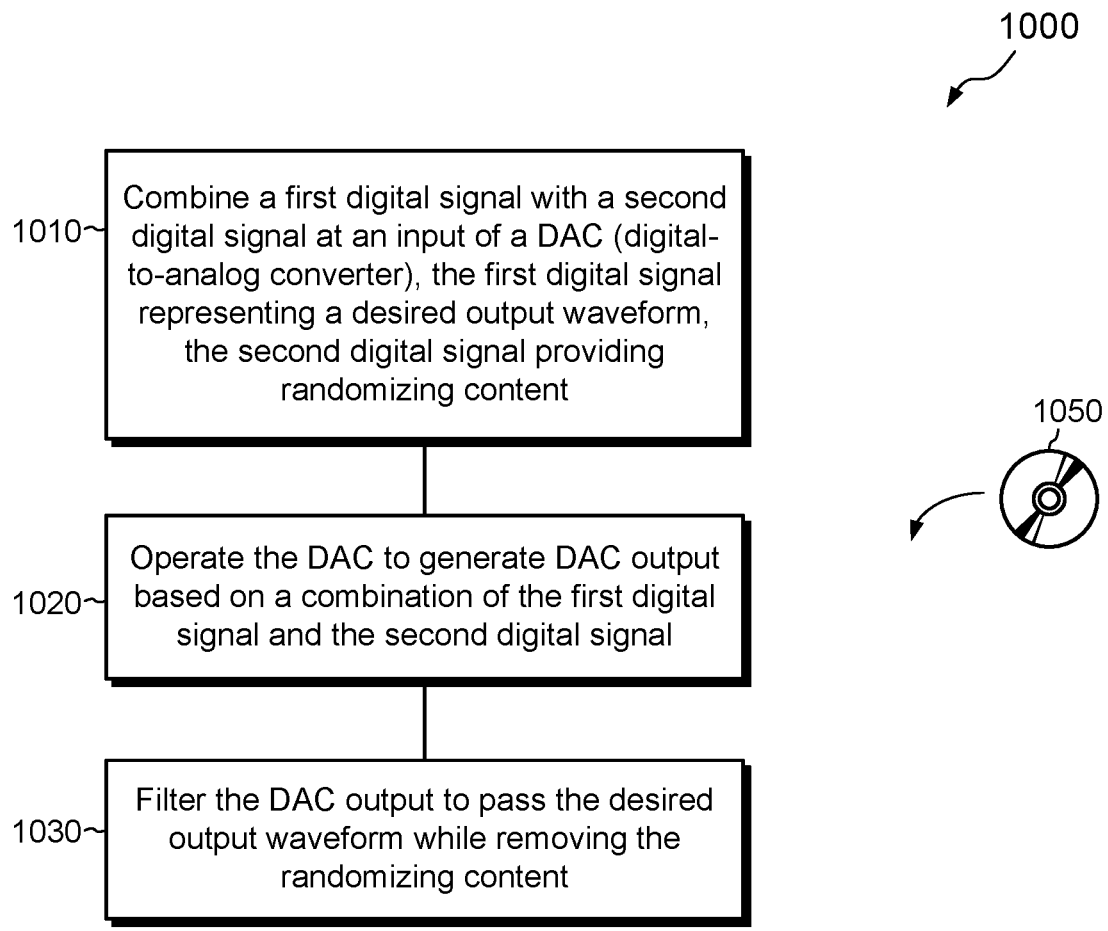
FIG. 10 is a flow chart showing an example method of generating an analog waveform.

FIG. 10 shows an example method 1000 of generating analog waveforms. The method 1000 is typically performed, for example, by the DDS 300 described in connection with FIG. 3. Such acts may also be performed in DAC circuits that are not DDSs. The various acts of method 1000 may be ordered in any suitable way. Accordingly, embodiments may be constructed in which acts are performed in orders different from that illustrated, which may include performing some acts simultaneously.

At 1010, a first digital signal 308a is combined with a second digital signal 318a at an input of a DAC 330. The first digital signal 308a represents a desired output waveform, and the second digital signal 318a provides randomizing content.

At 1020, the DAC 330 is operated to generate DAC output 332 based on a combination of the first digital signal 308a and the second digital signal 318a.

At 1030, DAC output 332 is filtered (e.g., by filter 340) to pass the desired output waveform while removing the randomizing content.

An improved technique has been described for generating analog waveforms. The technique includes combining a desired, in-band signal with a randomizing, out-of-band signal at an input of a DAC, operating the DAC to generate DAC output based on a combination of the desired signal and the randomizing signal, and filtering the DAC output to pass the desired signal while removing the randomizing signal.

Having described certain embodiments, numerous alternative embodiments or variations can be made. For example, although embodiments have been described in which the desired output signal is a single tone, the desired output may instead include multiple tones. For example, additional DDS stages, like DDS Stage 1, may be provided for each additional desired output tone. The output of the waveform function of each such additional DDS stage can be provided as another input to combiner 320 (FIG. 3). Thus, the desired output may include any number of desired tones.

Further, although the examples provided above arise in the context of a DDS 300, embodiments are not limited to use in DDSs. Rather, embodiments may be constructed in any DAC circuits in which spurs are a concern.

Further, although features have been shown and described with reference to particular embodiments hereof, such features may be included and hereby are included in any of the disclosed embodiments and their variants. Thus, it is understood that features disclosed in connection with any embodiment are included in any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, ASIC, FPGA, and/or the like (shown by way of example as medium 1050 in FIG. 10). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Also, a "set of" elements can describe fewer than all elements present. Thus, there may be additional elements of the same kind that are not part of the set. Further, ordinal expressions, such as "first," "second," "third," and so on, may be used as adjectives herein for identification purposes. Unless specifically indicated, these ordinal expressions are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Also, and unless specifically stated to the contrary, "based on" is intended to be nonexclusive. Thus, "based on" should not be interpreted as meaning "based exclusively on" but rather "based at least in part on" unless specifically indicated otherwise. Although certain embodiments are disclosed herein, it is understood that these are provided by way of example only and should not be construed as limiting.

Those skilled in the art will therefore understand that various changes in form and detail may be made to the embodiments disclosed herein without departing from the scope of the following claims.

What is claimed is:

1. A method of generating analog waveforms, comprising:
   combining a first digital signal with a second digital signal at an input of a DAC (digital-to-analog converter), the first digital signal representing a desired output waveform, the second digital signal providing randomizing content;
   operating the DAC to generate DAC output based on a combination of the first digital signal and the second digital signal; and filtering the DAC output to pass the desired output waveform while removing the randomizing content.

2. The method of claim 1, wherein the first digital signal extends over a first bandwidth, and wherein the second digital signal extends over a second bandwidth, the first bandwidth distinct from the second bandwidth and higher in frequency than the second bandwidth.

3. The method of claim 2, wherein the first bandwidth has a lower frequency limit, wherein the second bandwidth has an upper frequency limit, and wherein the upper frequency limit of the second bandwidth extends to at least one-half the lower frequency limit of the first bandwidth.

4. The method of claim 3, wherein the upper frequency limit of the second bandwidth is a positive frequency, and wherein the second bandwidth further has a lower frequency limit that is a negative frequency.

5. The method of claim 4, wherein the negative frequency of the lower frequency limit of the second bandwidth has a same absolute value as the upper frequency limit of the second bandwidth.

6. The method of claim 2, wherein the second bandwidth extends over a frequency range that includes both positive and negative frequencies.

7. The method of claim 1, further comprising generating the second digital signal based at least in part on:
generating a sequence of multi-bit digital values, the multi-bit digital values being random or pseudo-random; and
transforming the multi-bit digital values into sinusoidally-varying digital values, the sinusoidally-varying digital values having frequencies based on the multi-bit digital values.

8. The method of claim 7, wherein the sequence of multi-bit digital values is generated at a first rate, wherein the DAC is activated to generate new output at a second rate, and wherein the second rate is a multiple of the first rate.

9. The method of claim 7, further comprising interpolating between successive multi-bit digital values of the sequence of multi-bit digital values, the interpolating causing the sinusoidally-varying digital values to change frequency incrementally over multiple time intervals between successive multi-bit digital values.

10. The method of claim 9, wherein interpolating between successive multi-bit digital values of the sequence of multi-bit digital values includes linearly interpolating, such that the sinusoidally-varying digital values change frequency linearly between successive multi-bit digital values.

11. The method of claim 1, wherein the first digital signal has a first amplitude, wherein the second digital signal has a second amplitude, and wherein the second amplitude is between 50% and 75% of the first amplitude.

12. The method of claim 1, wherein the first digital signal has a first amplitude, wherein the second digital signal has a second amplitude, and wherein the second amplitude is no greater than five times the first amplitude.

13. A direct digital synthesizer (DDS), comprising:
a combiner having a first input configured to receive a first digital signal, a second input configured to receive a second digital signal, and an output configured to provide a combined digital signal, the first digital signal representing a desired output waveform, the second digital signal providing randomizing content;
a DAC having an input configured to receive the combined digital signal and an output configured to provide an analog representation of the combined digital signal; and
a filter coupled to the output of the DAC, the filter configured to pass the desired output waveform and to remove the randomizing content.

14. The DDS of claim 12, further comprising:
a number generator of multi-bit digital values that are random or pseudo-random; and
a phase accumulator having an input coupled to the number generator and an output that provides the second digital signal as a sequence of sinusoidally-varying digital values having frequencies based on the multi-bit digital values.

15. The DDS of claim 13, wherein the number generator is configured to generate multi-bit digital values at a first rate, wherein the DAC is configured to generate new output at a second rate, and wherein the second rate is a multiple of the first rate.

16. The DDS of claim 13, further comprising an interpolator coupled between the number generator and the phase accumulator, the interpolator configured to interpolate between successive multi-bit digital values generated by the number generator.

17. The DDS of claim 16, wherein the interpolator is a linear interpolator configured to linearly interpolate between successive multi-bit digital values generated by the number generator.

18. A DAC (digital-to-analog converter) circuit, comprising:
a combiner configured to combine a first digital signal with a second digital signal to produce a combined signal, the first digital signal representing a desired output waveform, the second digital signal providing randomizing content;
a DAC coupled to the combiner, the DAC configured to generate DAC output based on the combined signal; and
a filter coupled to the DAC and configured to filter the DAC output by passing the desired output waveform while removing the randomizing content.

19. The DAC circuit of claim 18, wherein the filter is further configured to remove the randomizing content at lower frequencies and to pass the desired output waveform at higher frequencies.

20. The DAC circuit of claim 19, wherein the filter is further configured to remove the randomizing content at both positive and negative frequencies.

* * * * *